(12) United States Patent
Ewing et al.

(10) Patent No.: US 7,535,696 B2
(45) Date of Patent: May 19, 2009

(54) METHOD OF MOUNTING A POWER DISTRIBUTION APPARATUS IN A RACK

(75) Inventors: Carrel W. Ewing, Reno, NV (US);
Andrew J. Cleveland, Reno, NV (US);
James P. Maskaly, Sparks, NV (US);
Dennis W. McGlumphy, Sun Valley, NV (US)

(73) Assignee: Server Technology, Inc., Reno, NV (US)

( * ) Notice: Subject to any disclaimer, the term of this patent is extended or adjusted under 35 U.S.C. 154(b) by 0 days.

(21) Appl. No.: 12/005,476

(22) Filed: Dec. 24, 2007

(65) Prior Publication Data
US 2008/0198536 A1 Aug. 21, 2008

Related U.S. Application Data

(63) Continuation of application No. 11/715,521, filed on Mar. 7, 2007, now Pat. No. 7,312,980, which is a continuation of application No. 11/135,763, filed on May 23, 2005, now Pat. No. 7,196,900.

(60) Provisional application No. 60/624,287, filed on Nov. 1, 2004, provisional application No. 60/573,405, filed on May 21, 2004.

(51) Int. Cl.
*H02B 1/34* (2006.01)

(52) U.S. Cl. .................. 361/622; 361/610; 361/626; 361/641; 175/50; 307/39; 307/41; 307/112; 307/113; 312/223.2; 312/265.3; 211/26

(58) Field of Classification Search ......... 361/622–628, 361/642–648, 727–732, 833, 836, 600–602; 307/39, 112, 10.1, 150, 29, 38, 41, 115, 125, 307/126, 141, 141.4, 143, 34, 11, 18, 32, 307/43; 337/186, 189; 312/223.1, 223.2, 312/233.3, 265.1, 265.3, 265.5; 174/48, 174/49, 50, 70 C, 72 C, 95, 72 R, 480, 481, 174/650; 248/200, 508, 510; 211/182, 189, 211/26, 162
See application file for complete search history.

(56) References Cited

U.S. PATENT DOCUMENTS 5,821,636 A * 10/1998 Baker et al. .................. 307/70

(Continued)

FOREIGN PATENT DOCUMENTS

JP 02003044180 A * 2/2003

*Primary Examiner*—Michael V Datskovskiy
(74) *Attorney, Agent, or Firm*—Holland & Hart LLP

(57) ABSTRACT

Embodiments of a power distribution apparatus that is adaptable to be readily mounted within a variety of differing types of electronic equipment racks are herein described. One such embodiment provides power distribution apparatus having an upper mounting adapter. The upper mounting adapter may be attachable to a housing of the power distribution apparatus or may be integrally formed therein. Another embodiment provides power distribution apparatus having a lower mounting adapter. The lower mounting adapter may be attachable to the housing of the power distribution apparatus or may be integrally formed in the housing. A further embodiment provides power distribution apparatus having at least one mounting peg mounting in mating holes formed in a rack. The mounting pegs may be attachable to a housing of the power distribution apparatus or may be integrally formed therein. Other embodiments provide power distribution apparatus having rack mounting channels or access openings formed in at least one of a plurality of sides.

6 Claims, 15 Drawing Sheets

U.S. PATENT DOCUMENTS

| | | | |
|---|---|---|---|
| 6,238,029 B1 * | 5/2001 | Marzec et al. | 312/265.3 |
| 6,552,542 B1 * | 4/2003 | Overall | 324/309 |
| 6,741,442 B1 * | 5/2004 | McNally et al. | 361/166 |
| 6,882,530 B2 * | 4/2005 | Cyphers et al. | 361/686 |
| 6,967,283 B2 * | 11/2005 | Rasmussen et al. | 174/50 |
| 7,324,006 B2 * | 1/2008 | Godard | 340/664 |
| 7,425,682 B2 * | 9/2008 | Rasmussen et al. | 174/68.1 |

* cited by examiner

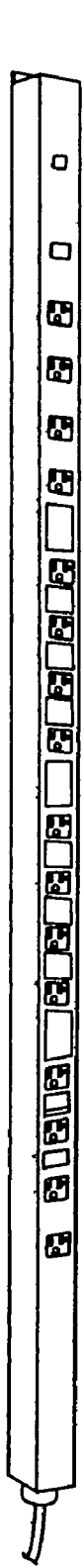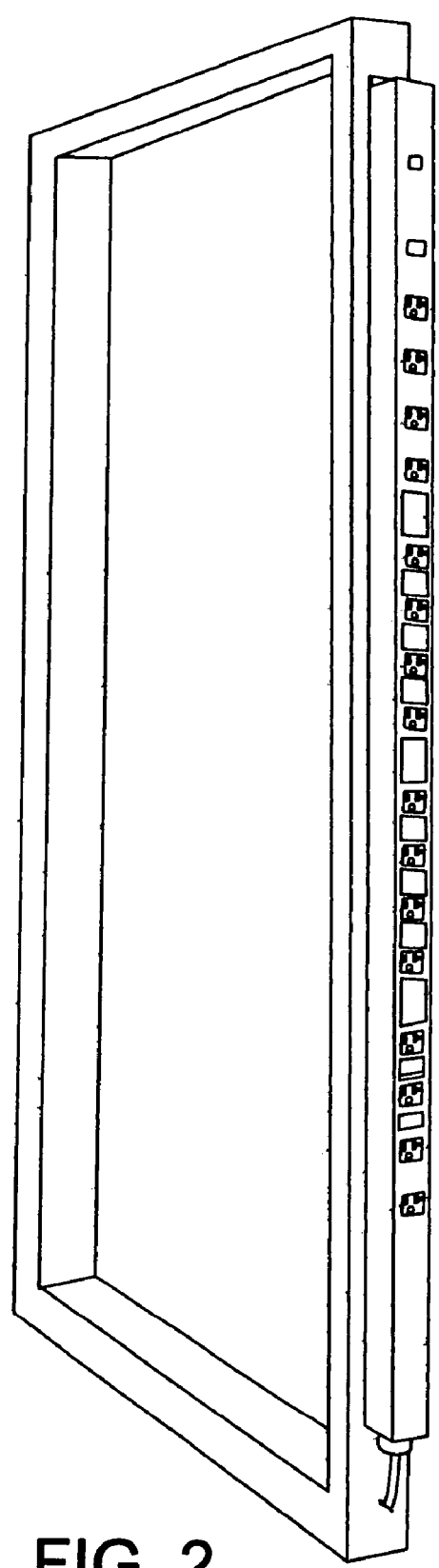
FIG. 1
(Prior Art)
FIG. 2
(Prior Art)

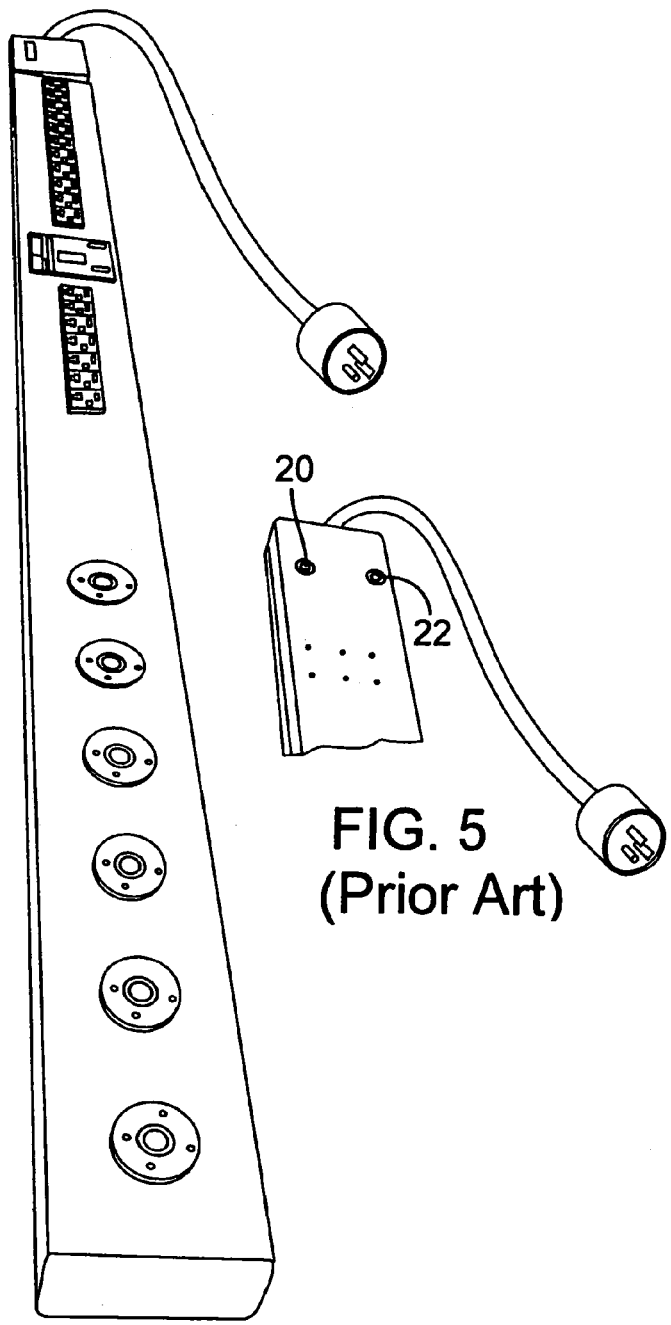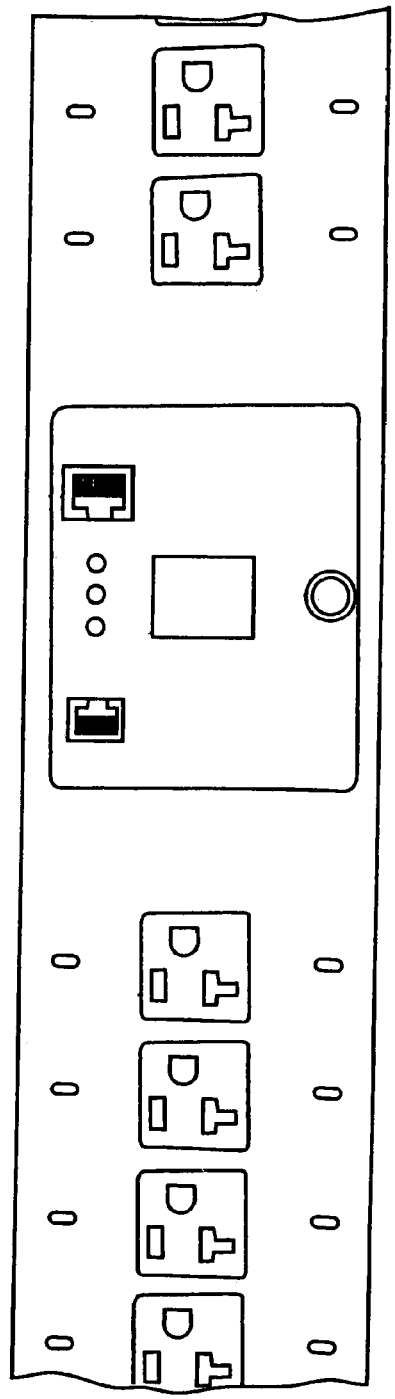
FIG. 5
(Prior Art)
FIG. 3
(Prior Art)
FIG. 4 (Prior Art)

METHOD OF MOUNTING A POWER DISTRIBUTION APPARATUS IN A RACK

CROSS REFERENCE TO RELATED APPLICATIONS

This application is a continuation of U.S. patent application Ser. No. 11/715,521, filed Mar. 7, 2007, now U.S. Pat. No. 7,312,980 which is a continuation of U.S. patent application Ser. No. 11/135,763, filed May 23, 2005, which claims the benefit of U.S. Provisional Patent Application No. 60/573,405, filed May 21, 2004 (now U.S. Pat. No. 7,196,900), and U.S. Provisional Patent Application No. 60/624,287, filed Nov. 1, 2004. These applications are hereby incorporated by reference.

FIELD

The present invention relates to rack mountable power distribution apparatus. More particularly, the present invention relates to such power distribution apparatus that are adaptable to mount within a variety of differing types of electronic equipment racks (particularly cabinet racks) or in differing orientations within such racks.

BACKGROUND

Electronic equipment racks commonly consist of rectangular or box-shaped housings sometimes referred to as a cabinet or a rack. Electronic equipment is commonly mountable in such racks so that the various electronic devices are aligned vertically one on top of the other in the rack. Often, multiple such racks are oriented side-by-side, with each containing numerous electronic components and having substantial quantities of associated component wiring located both within and outside of the area occupied by the racks.

Power distribution units have long been utilized to supply power to the equipment in such racks, to remotely monitor and control the electronic equipment in such racks, and the supply of power to the power distribution unit. One particularly common such power distribution unit consists of an elongated box housing that has one or more power inputs and a number of power outputs extending along the longitudinal face of the unit. This power distribution unit is designed to mount vertically adjacent or secured to the external rear side of the rack. Typically, this power distribution unit is mounted to the exterior of a rear side of the rack. In this fashion, the power supplied to the unit is then distributed through horizontally extending power outputs to the horizontally co-aligned electronic components mounted in the rack.

An example of such a prior power distribution unit is shown in FIG. 1 and is sold under the trademark "Power Tower" by Server Technology, Inc., of Reno, Nev. FIG. 2 shows this prior art Power Tower power distribution unit secured to the outer edge of a generally rectangular rack to supply power to electronic components mounted within the rack.

Generally, power distribution units have been designed to be mounted in one particular rack configuration of the multiple configurations that are typically available. This can be inconvenient for users of power distribution units. For example, users who change from one type of rack to a different type of rack must often obtain new power distribution units that can be mounted in the new racks. This can be very expensive and time consuming. Because of the different mounting requirements, manufacturers typically must make, and suppliers must stock, separate power distribution units for each type of rack configuration. This can be very inefficient.

An example of a prior art power distribution unit designed for a particular mounting configuration is a power distribution unit made by American Power Conversion Corp. (APC) shown in FIGS. 3-5 that is designed to be mounted in only one type of rack, which is also made by APC. APC's rack is shown in FIGS. 6-10. The APC unit has mounting disks or pegs, e.g., 20, 22, secured to the outer periphery of the back side of the APC unit. These mounting disks or pegs 20, 22 slidably mount in mating slotted disk mounting apertures, e.g., 24, 26, in the rearward portion of the side of an APC rack (see FIGS. 8 and 9).

The APC power distribution unit is therefore slidably mounted on or adjacent the rear side of the APC rack and remains slidably removable from the APC rack. The APC unit can be unintentionally jolted out of position on the APC rack by upward and downward movement of the rack, such as by accidental contact of an operator with the APC unit or in an earthquake of moderate intensity.

As noted above, the APC unit is not generally designed to be mounted to racks other than those made by APC, that is, racks having slotted apertures for receiving the mounting pegs of the APC power distribution unit. Similarly, the APC racks are typically not designed to accept power distribution units other than those made by APC. In addition, the APC units do not include fuses or circuit breakers that are accessible without removing the unit from a rack and opening the housing of the unit.

SUMMARY

In some embodiments, a power distribution apparatus (PDA), or power distribution unit, as it is sometimes referred to herein, is adaptable to be readily mounted within a variety of differing types of electronic equipment racks, particularly racks that provide at least a substantial box frame or housing within the periphery of which entire electronic units may be mounted.

The power distribution unit can include an upper mounting adapter that may be secured to an upper portion of a PDA and a rack. In some implementations, the upper mounting adapter comprises a bracket having a horizontal plate portion attachable to the upper portion of the PDA and a vertical plate portion attachable to the rack. The vertical plate portion may have a fastener opening, such as a slot, for allowing a fastener to pass therethrough and be received by the rack. In other implementations the upper mounting adapter comprises a plate vertically mountable to the rack, the plate abutting the PDA when the PDA is mounted to the rack, thereby securing the PDA against movement.

In some embodiments, a PDA has a bottom mounting adapter that may be secured to a bottom portion of the power distribution apparatus and a rack. In some implementations, the bottom mounting adapter is a U-shaped bracket having a horizontal plate with vertically downwardly extending plates at two opposing ends of the horizontal plate. The channel formed by the U-shaped bracket is adapted to abut a portion of the rack.

Some embodiments are directed to a PDA having a housing. The housing may have a mounting channel (or notch). The mounting channel may be formed in a side, typically the rear side, of the PDA and may allow the PDA to be mounted more closely to the side of a rack having a protrusion. The mounting channel is adapted to fit over the protrusion when the PDA is secured to the rack.

For example, as discussed above, some racks utilize support bars on the side of the rack, or otherwise have protrusions that can limit how closely prior PDAs can be placed to the rack. A housing with an appropriately configured channel may allow a PDA to be mounted more closely to a rack, particularly a peripheral side of a rack. In this way, the PDA occupies less of the interior of the rack and allows more room for electrical components and associated wiring. The mounting channel may serve other purposes, such as to help secure the PDA in position or render the rack more rigid.

Further embodiments can provide a PDA having a housing and a plurality of mounting pegs coupled to a side or face of the housing or within a mounting channel. The mounting pegs are configured to engage corresponding slotted mounting apertures in a rack. In certain embodiments, the mounting pegs are removable from the side of the housing. In at least one embodiment, the mounting pegs are removably secured to the housing with screws.

In yet further embodiments, a PDA having one or more fuses, circuit breakers, or circuit indicators facing outward from a side of the PDA other than the side of the PDA mounted to a rack. The fuses or other components of the PDA are thereby visible and accessible without removing the PDA from the rack. In certain embodiments, the PDA is readily adaptable to mount to either side of the rack and provide visibility of the one or more fuses, circuit breakers, or circuit indictors, regardless of the side of the rack to which the power distribution apparatus may be mounted.

Of course, some embodiments may contain one or more features described above. For example, at least one embodiment provides a power distribution apparatus having a mounting channel section and being useable with an upper mounting adapter, a lower mounting adapter, or mounting pegs. This embodiment can be highly adaptable and may be used in a variety of different racks. For example, one PDA may easily be adapted to be mounted a variety of racks, such as those manufactured by HP, IBM, and APC, which may reduce manufacturing costs, supplier inventory, and may allow customers to avoid having to purchase new PDAs when they change to a different style of rack. This embodiment may further include one or more fuses visible from the rear of the rack.

In some embodiments, the power distribution unit can also provide a high density power distribution unit, in which the number or power outlets provided exceeds twelve outlets and, in some implementations, provides multiple power inputs and at least twenty-one outlets per power input. One particular implementation is a polyphase, such as three-phase, power distribution unit, which may include two three phase power inputs and fourteen outlets per phase per power input.

The power outlets in the power distribution unit can extend vertically along a face of the unit, facing away from a side of, and toward the interior of, the rack when mounted in the rack. In this manner, wiring from rack-mounted equipment to the outlets in the power distribution unit may be oriented to remain within the confines of the periphery of the rack.

The PDA may be mounted in an electronic equipment rack. The rack may be of the type for mounting electronic equipment vertically, and may have doors on one or more side. At least certain embodiments allow wires of devices attached to the PDA to be kept within the external periphery of the rack, even if the sides of the rack are open.

There are other features and advantages of the various embodiments. They will become apparent as this specification proceeds. In this regard, it is to be understood that the scope of the present invention is not to be determined by whether a given embodiment includes all features or advantages recited herein or solves all problems or limitations in the prior art noted in this specification. The foregoing and other objects, features, and advantages of the invention will become more apparent from the following detailed description, which proceeds with reference to the accompanying figures.

BRIEF DESCRIPTION OF THE DRAWINGS

FIG. 1 is a perspective view of a prior power distribution unit.

FIG. 2 is a perspective view of the prior power distribution unit of FIG. 1 secured to the outer edge of a generally rectangular rack.

FIG. 3 is a perspective view of a prior power distribution unit.

FIG. 4 is a fragmentary top view of the prior power distribution unit of FIG. 3.

FIG. 5 is a fragmentary perspective view of the prior power distribution unit of FIG. 3.

DETAILED DESCRIPTION

Figure 6:
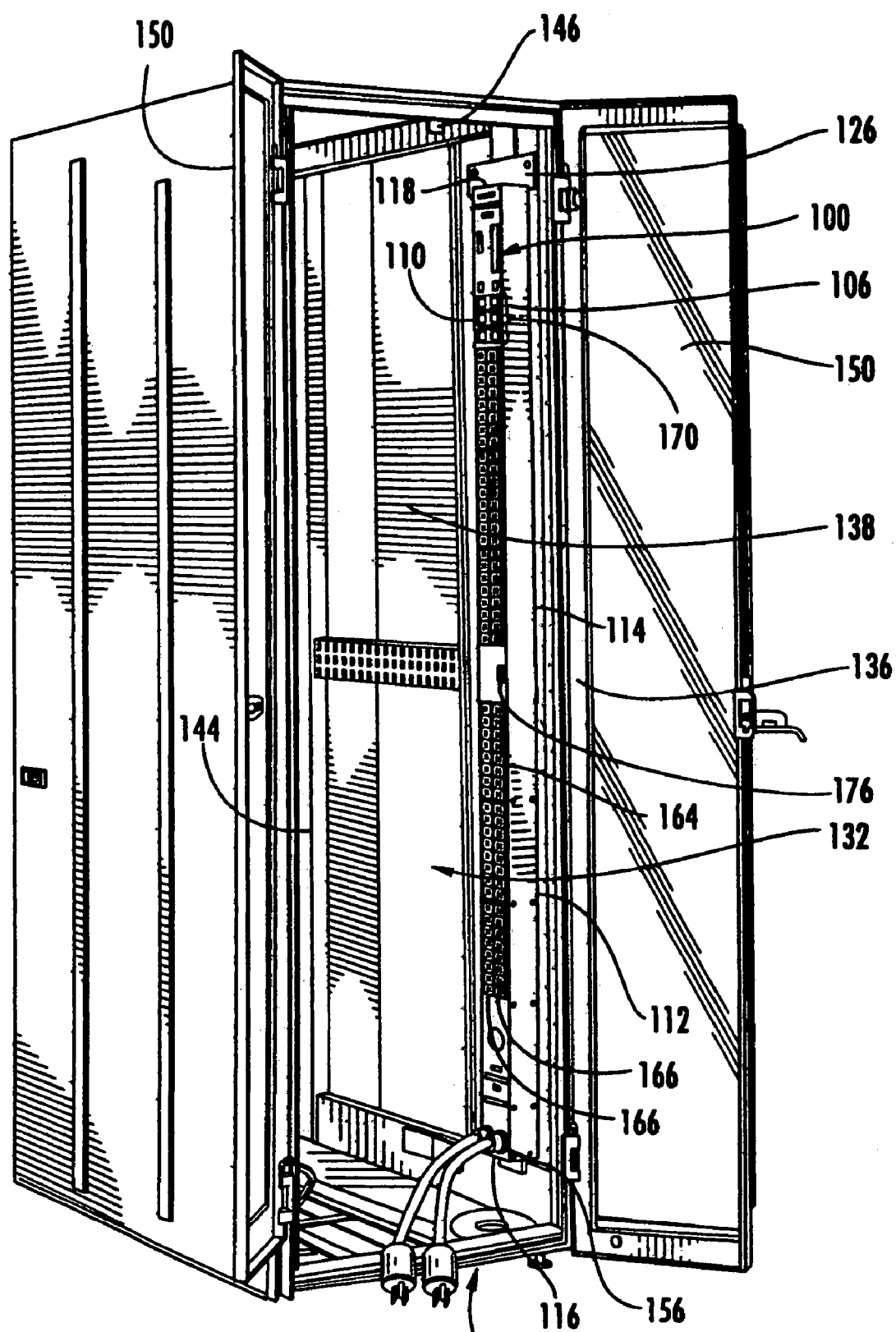
FIG. 6 is a perspective view of a power distribution unit according to one embodiment mounted vertically within a cabinet rack of a first type.

FIG. 6 illustrates a power distribution apparatus (PDA) 100 having a housing 106. The housing 106 may be of any suitable dimension. The housing 106 is sized for mounting in a rack, such as rack 120. The housing 106 is shown as a rectangular box, having longitudinally extending front 110 and back faces 112, two longitudinally extending lateral sides 114, a first end 116, and a second end 118. Of course, shapes other than rectangular boxes could be used. The housing 106 may be made of a substantially rigid and durable material, such as metals or plastics. In at least one embodiment, the housing 106 is made of sheet metal.

The housing 106 may include an upper mounting adapter 126 for mounting the housing 106 to the rack 120, which may be a rack manufactured by American Power Conversion Corp. of West Kingston, R.I., adjacent an electronic equipment mounting area 132 within the confines of the rack 120. The housing 106 may thereby be securely mounted vertically within the rack 120. In at least one embodiment, the rack 120 is secured adjacent the rearward edge 136 of one side wall 138 of the rack 120 that extends from the front face 144 of the rack 120 toward the rear face 146 of the rack 120. The rack 120 may be coverable by one or more doors 150 (shown, however, as being open in FIG. 6).

One or more power inputs 156 may be coupled to the housing 106. In the illustrated embodiment, the power inputs are connected through the front face 110 of the housing 106, proximate the first end 116 of the housing 106. The power inputs 156 may be chosen to connect to a power supply (not shown) to provide a desired level of power to one or more electrical appliances (not shown). The power inputs 156 may be adapted to employ single phase power or polyphase power, including double or triple-phase power.

The housing 106 may have one or more outlet apertures 164 through which a plurality of power outlets 166 extend. As shown, the apertures 164 are rectangular openings in the front face 110 of the housing 106. Each aperture 164, and associated power outlets 166, may represent a discrete power unit, or "branch." Each branch may be independently supplied with power, controlled, and wired. The power outlets 166 may provide the same or varying amounts of power, such as 120V or 240V, to connected devices (not shown).

One or more displays 170 may be provided on the housing 106. As shown, six displays 170 are viewable on the front face 110 proximate the second end 118 of the housing 106. The displays 170 may be LED displays, LCD displays, or any other suitable display device. The displays 170 may display information to a user, such as information regarding the status of the PDA 100 or the outlets 166. In at least one embodiment, the displays 170 provide information regarding the amount of current drawn by one or more outlets 166, including groupings of outlets 166.

Power distribution apparatus 100 may also be provided with one or more communication connections 176. The communication connections 176 may be used to send information from, and provide information to, the PDA 100. For example, the communication connection 176 may be used to provide information over a network, such as the Internet, regarding the PDA 100 to a remote user. In other embodiments, the communication connection 176 may be used by service technicians to troubleshoot, program, or obtain data from the PDA 100.

Figure 7:
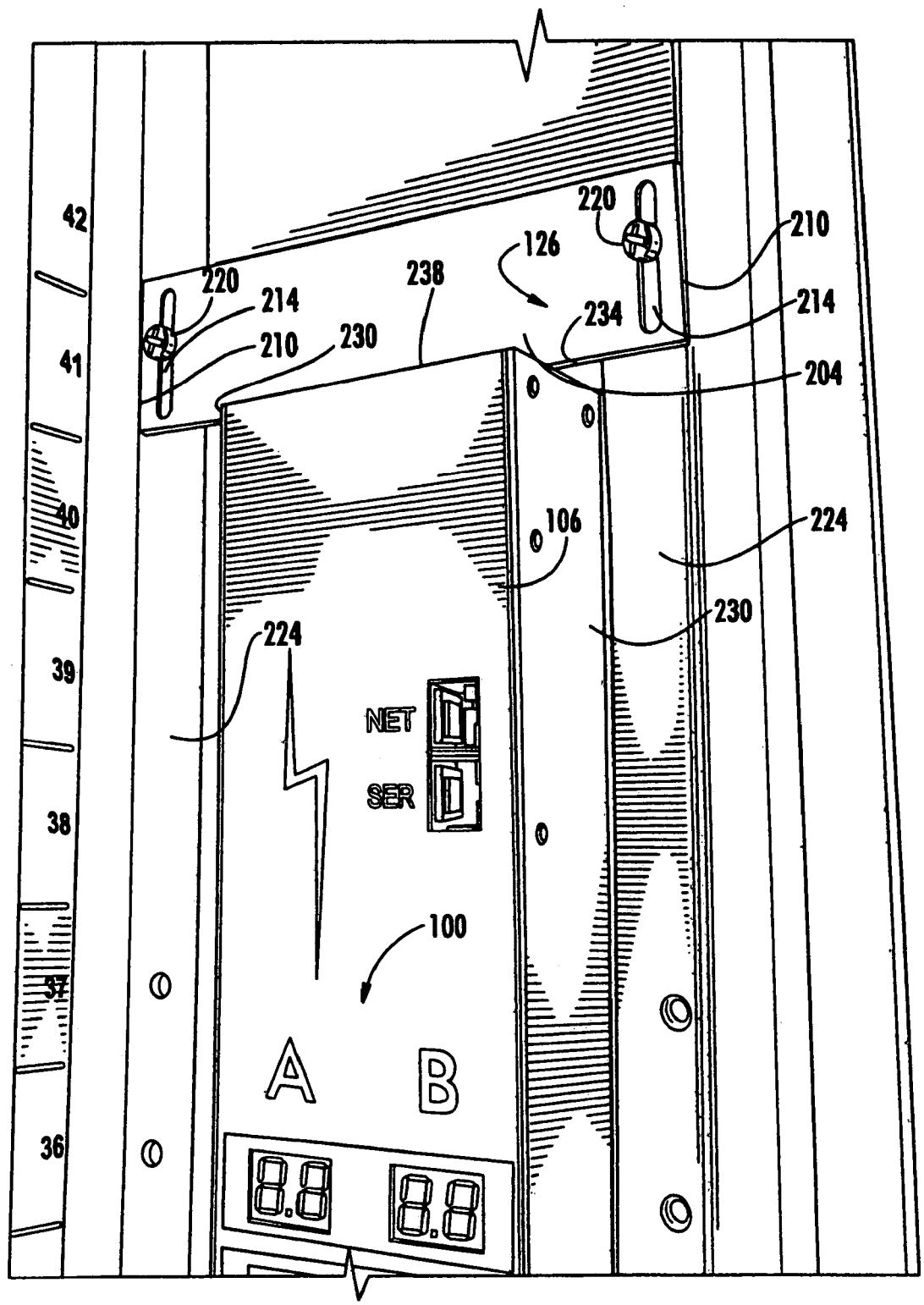
FIG. 7 is an enlarged fragmentary perspective view of the power distribution unit of FIG. 6 showing, in particular, an upper mounting adaptor.

FIG. 7 presents a more detailed view of the upper mounting adapter shown in FIG. 6. As shown in FIG. 7, the upper mounting adapter 126 is a bracket having a planar rectangular plate 204. Rectangular plate 204 is shown positioned vertically, with the length of the rectangular plate 204 extending horizontally. Adjacent each of opposing vertically extending sides 210 of the rectangular plate 204, a fastener slot 214 extends vertically upwardly, parallel to each adjacent side 210 of the rectangular plate 204. A fastener 220, such as a screw, a nail, a bolt, or a pin, penetrates the fastener slot 214 and a mating horizontally extending fastener passage (not shown) drilled into the vertically extending cabinet rack side wall ridge 224 adjacent a vertical side 230 of the PDA 100. In at least one embodiment, the fastener 220 is a self-tapping screw.

The lower horizontal edge 234 of the rectangular plate 204 abuts the horizontally extending top side 238 of the housing 106. In this manner, the rectangular plate 204, when secured in position by fasteners 220, at least partially secures the PDA 100 to the rack 120. Although the upper mounting adapter 126 has been shown and described as separate from the PDA 100, the upper mounting adapter 126 could be integrally formed in, or coupled to, the PDA 100.

Figure 8:
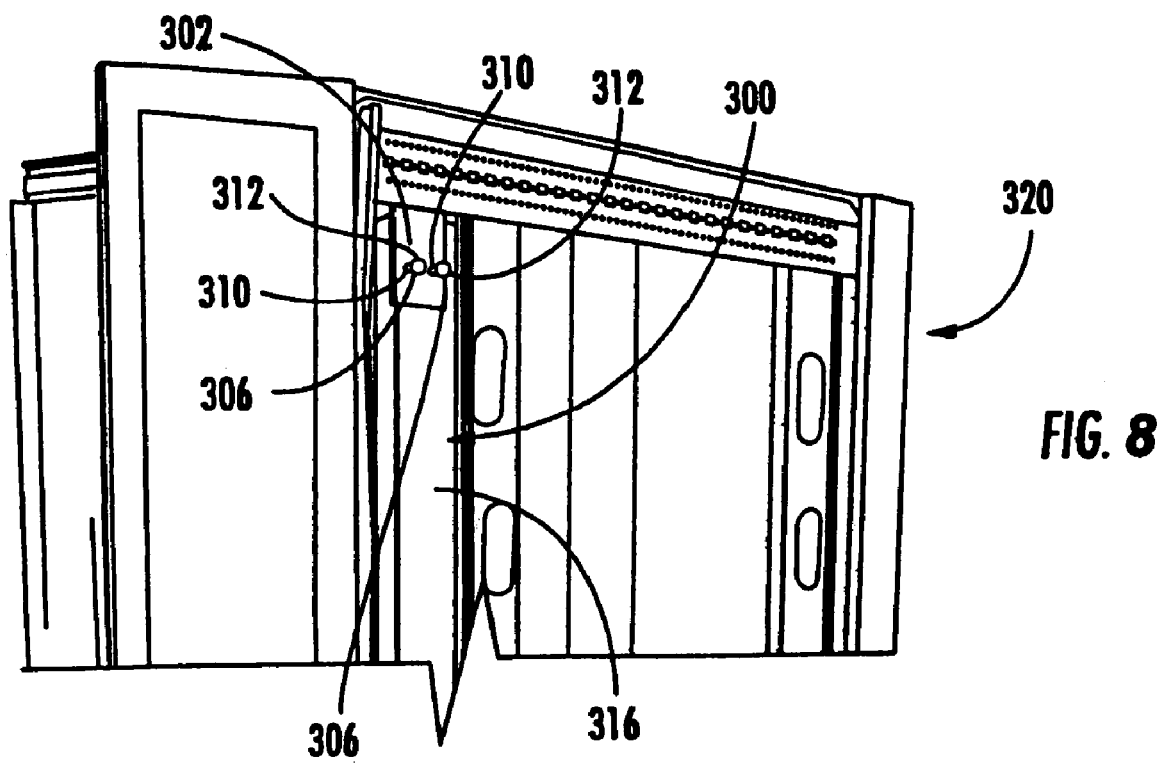
FIG. 8 is a perspective view of the back of the power distribution unit of FIG. 6 showing mounting pegs for securing the power distribution unit to the rack.

With reference now to FIG. 8, a PDA 300 may be provided with one or more mounting pegs 306. In at least one embodiment, a pair of mounting pegs 306 are provided. In a further embodiment, at least two pairs of mounting pegs 306 are provided. The mounting pegs 306 may be secured to a housing 302 of the PDA 300 by inserting fasteners 310, such as screws, nails, bolts, pins and the like, through fastener passages (not shown) in the housing 302. Alternatively, the mounting pegs 306 may be integrally formed on the housing 302. The mounting pegs 306 may be constructed from any suitable material, including metals, plastics, and rubber. The mounting pegs 306 may be shaped and sized as needed to mount to a particular rack 320. The mounting pegs 306 may have a mushroom shaped end 312 in order to more securely anchor the PDA 300 to the rack 320. As shown in FIG. 8, the mounting pegs 306 are located on opposing sides of the same vertical point on the back side 316 of the housing 302 and extend horizontally therefrom.

Figure 9:
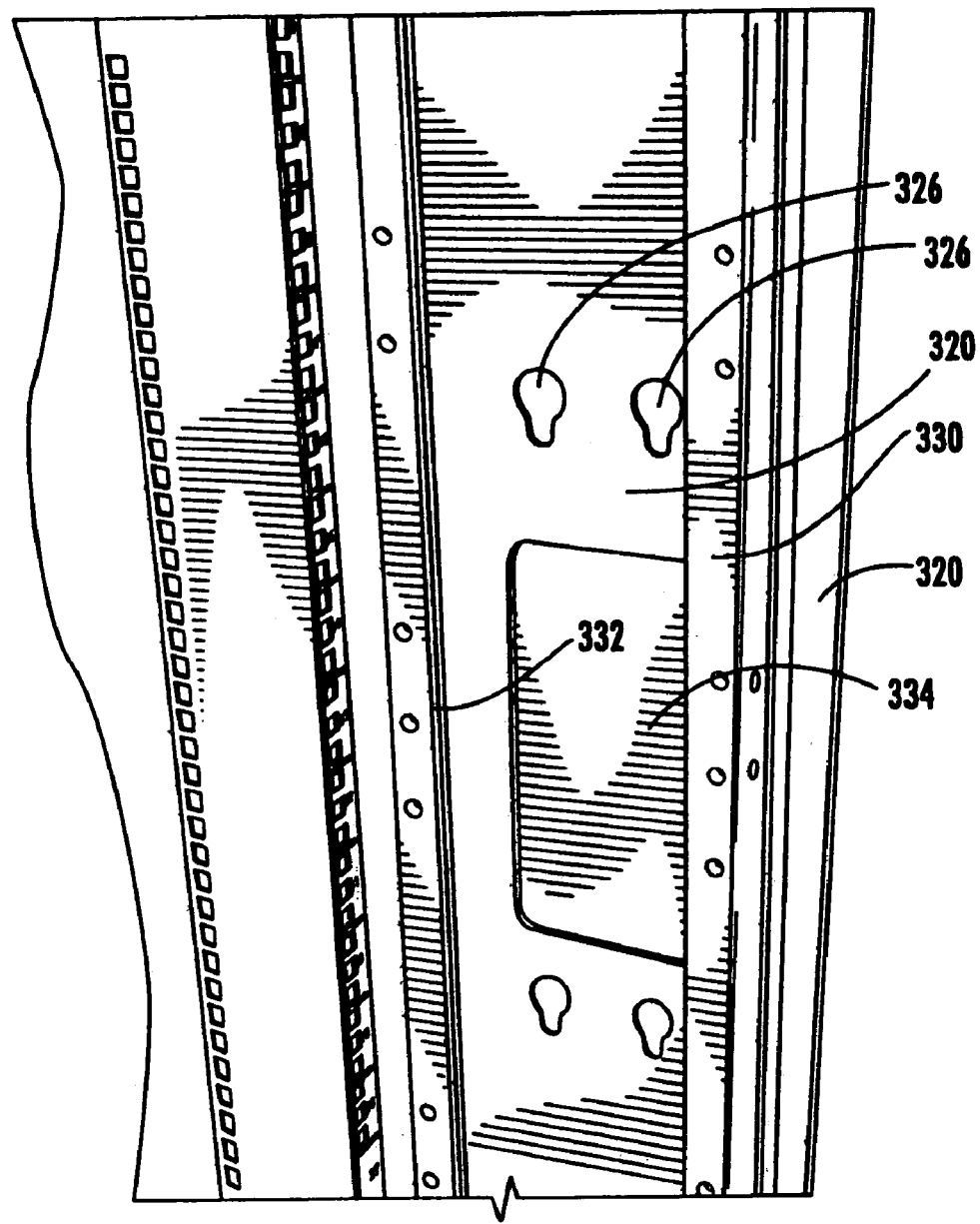
FIG. 9 a perspective view of a portion of the rack shown in FIG. 6, showing mounting apertures for receiving the mounting pegs shown in FIG. 8.

As shown in FIG. 9, the mounting pegs 306 may be used to secure the housing 302 to the rack 320 by placing the mounting pegs 306 through mounting apertures 326 in the rack 320. In the embodiment shown in FIG. 9, the mounting apertures 326 have an upside-down teardrop (thick-thin) shape, although other configurations could be used. The mounting pegs 306 and the upper mounting adapter 126 (FIGS. 6 and 7) may be used to cooperatively secure the housing 302 to vertically extending side wall ridges 330, 332 adjacent the planar vertical side wall 334 of the rack 320.

In operation, the mounting pegs 306 slidably penetrate the mating slotted mounting apertures 312. Note that the housing 302 is mounted using mounting pegs 306 and then secured into position using the upper mounting adapter 126 (FIGS. 6 and 7). Using the upper mounting adapter 126 in conjunction with the mounting pegs 306 may result in a more secure attachment of the housing 302 to the rack 320 and reduce the chance that the housing 302 may be inadvertently dislodged from the rack 320. This arrangement also can make the associated rack 320 more rigid and secure.

Figure 10:
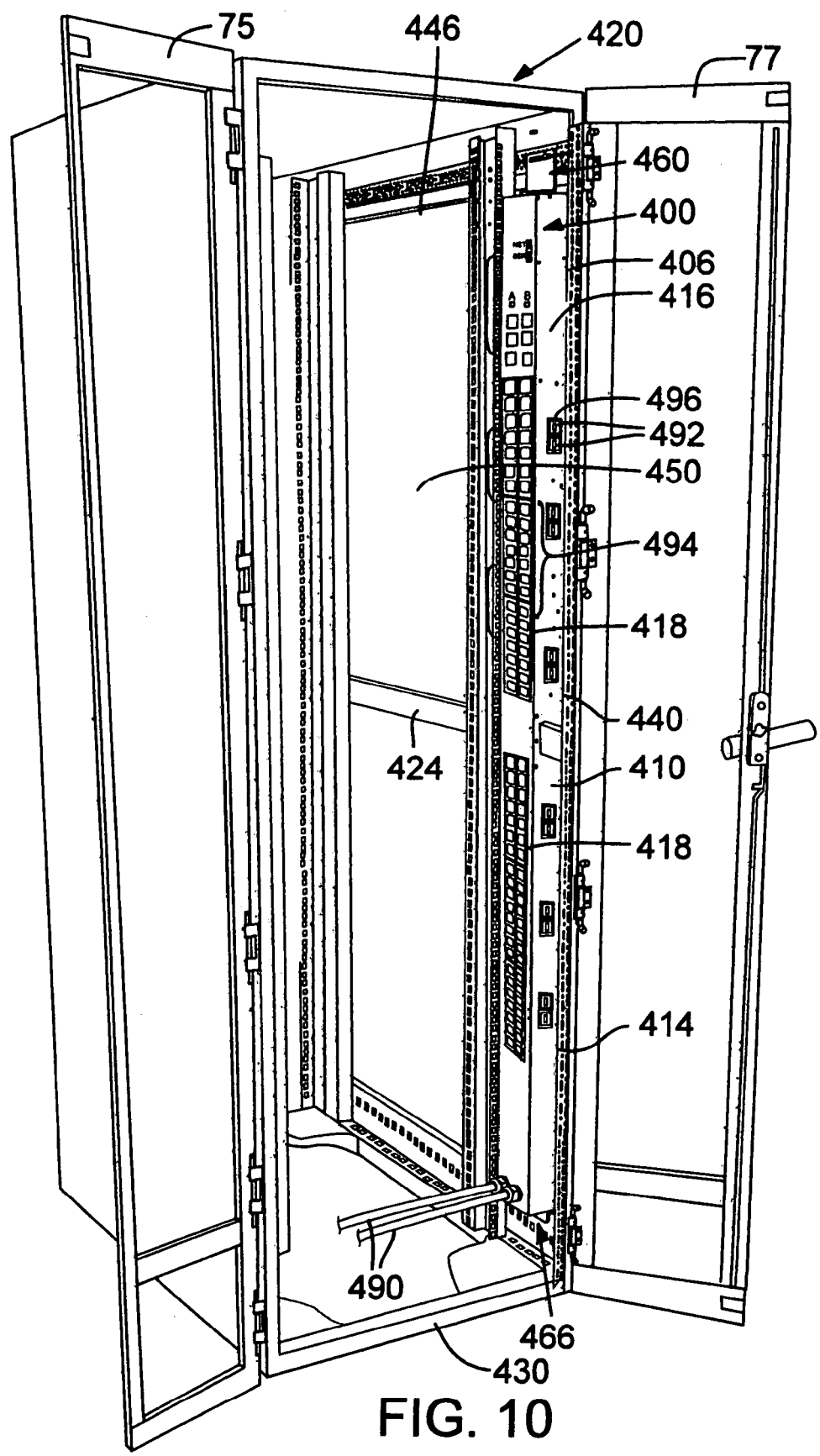
FIG. 10 is a perspective view of a power distribution unit according to one embodiment mounted vertically within a cabinet rack of a second type.

Another embodiment of a PDA 400 having a housing 406 is shown in FIG. 10. The PDA 400 has the same basic external housing structure as the PDA 100 (FIGS. 6 and 7) but is adapted for a particular rack 420, such as that manufactured by Hewlett Packard Co. of Palo Alto, Calif. The rack 420 has a horizontally extending support arm 424 extending from the front side (not shown in FIG. 10) to the rear side 430 of the rack 420.

Figure 11:
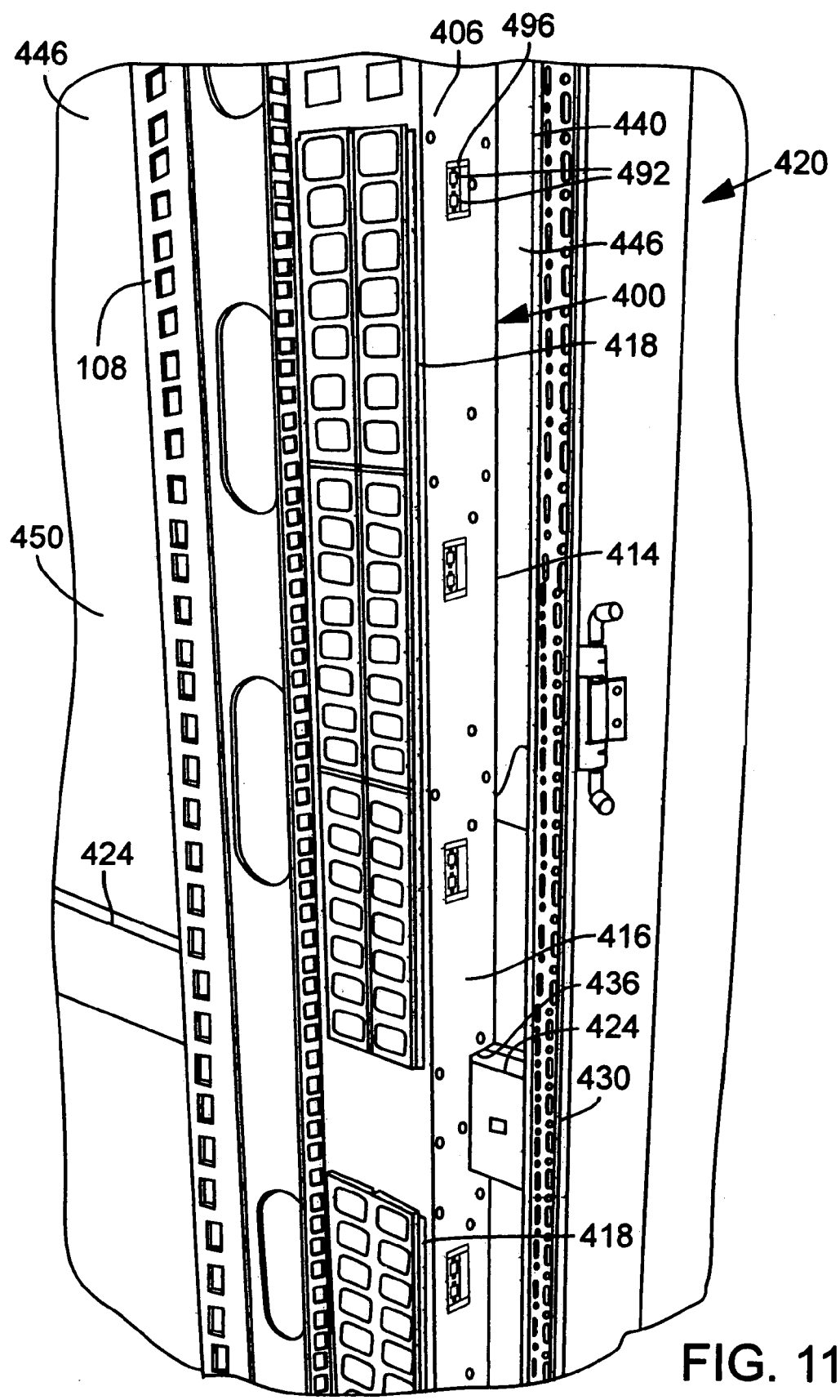
FIG. 11 is an enlarged fragmentary perspective view of the power distribution unit of FIG. 10 showing, in particular, a support brace channel penetrating the back side of the unit.

With reference to FIG. 11, the housing 406 may be provided with a channel 436. The channel 436 may be a U-shaped notch in the housing 406. The channel 436 is shown located approximately in the middle of the housing 406, between two outlet apertures 418. The channel 436 is formed by U-shaped cut-out sections in both lateral sides 416 (one of which is shown in FIGS. 10 and 11), thereby providing a recessed section in the back face 414 of the housing 406. The channel 436 may be sized as desired to fit over a protrusion, such as the horizontally extending rack support art 424 or otherwise possibly obstructing protrusion or element in the rack 420.

As shown in FIGS. 10 and 11, the channel 436 can allow the PDA 400 to be closely mounted to the rack 420, even if the rack 420 has reinforcement bars 424 or other protrusions, in order to maximize available interior access space behind electronic equipment mounted in the rack. The location, shape, and size of the channel 436 can be varied as desired to accommodate a variety of racks and mounting configurations. Additionally, more than one channel 436 may be included in the housing 406. When so mounted, the back side 440 of the housing 406 is relatively close to the side wall 446 of the rack 420. The use of the channel 436 can therefore increase the amount of central wiring area in the rack 420 and may allow easier access to the electronic equipment (not shown) in the electronic equipment mounting area 450 in the rack 420.

In the particular configuration shown in FIG. 10, the power distribution apparatus 400 is adapted to receive and distribute power from two three phase power inputs 490. This provides a total of six branches of power outlets—three phases of power per each of the two inputs 490. Each such branch is fused by two fuses, e.g., 492, one for each of the two sets of seven power outlets 494 supported by the branch. The two fuses 492 for the branch are visible through a polycarbonate window 496 removably mounted by screws (not shown), which penetrate mating passages (not shown) in the window 496 and the planar side wall 410 of the housing 406. The polycarbonate window 496 thus faces the rear side 430 (including rear doors 75, 77 when closed) of the rack 420 and is readily visible to an operator located adjacent the rear side 430 of the rack 420.

Figure 12:
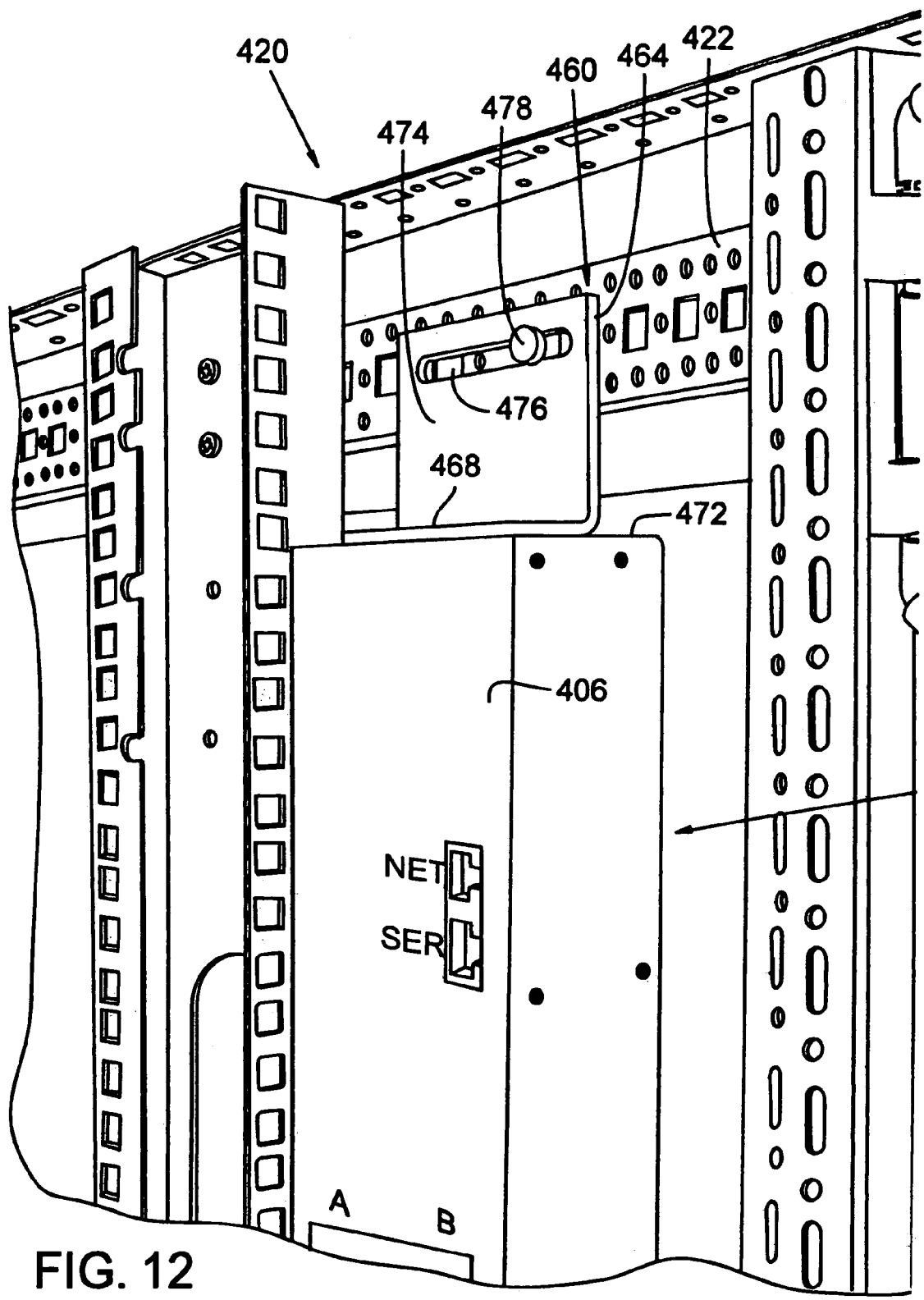
FIG. 12 is an enlarged fragmentary perspective view of the power distribution unit of FIG. 10 showing, in particular, an upper angled mounting bracket.

The housing 406 is secured in position in the rack 420 by an upper mounting bracket 460 in cooperation with a lower mounting adapter 466. With reference now to FIG. 12, the upper mounting adapter 460 may include an angled mounting bracket 464 having a horizontal lower planar arm 468 abutting a coplanar upper planar side 472 of the housing 406. An upper planar arm 474 extends vertically from, and perpendicularly to, the plane of the lower planar arm 468. The upper planar arm 474 is shown having a transversely extending fastener slot 476 adjacent its upper edge. A fastener 478, such as a nail, a pin, a bolt, a screw, or a self tapping screw, penetrates the fastener slot 476 and a mating passage (not shown) in the cabinet like structure 422 of the rack 420 in order to secure the upper angled mounting bracket 464 in the desired position with respect to the rack 420 and the power distribution apparatus 400. In addition, lower arm fasteners (not shown), such as screws, bolts, nails, pins, etc., penetrate mating circular passages (not shown) in the lower planar arm 468 and the upper planar side 472 of the housing 406.

Figure 13:
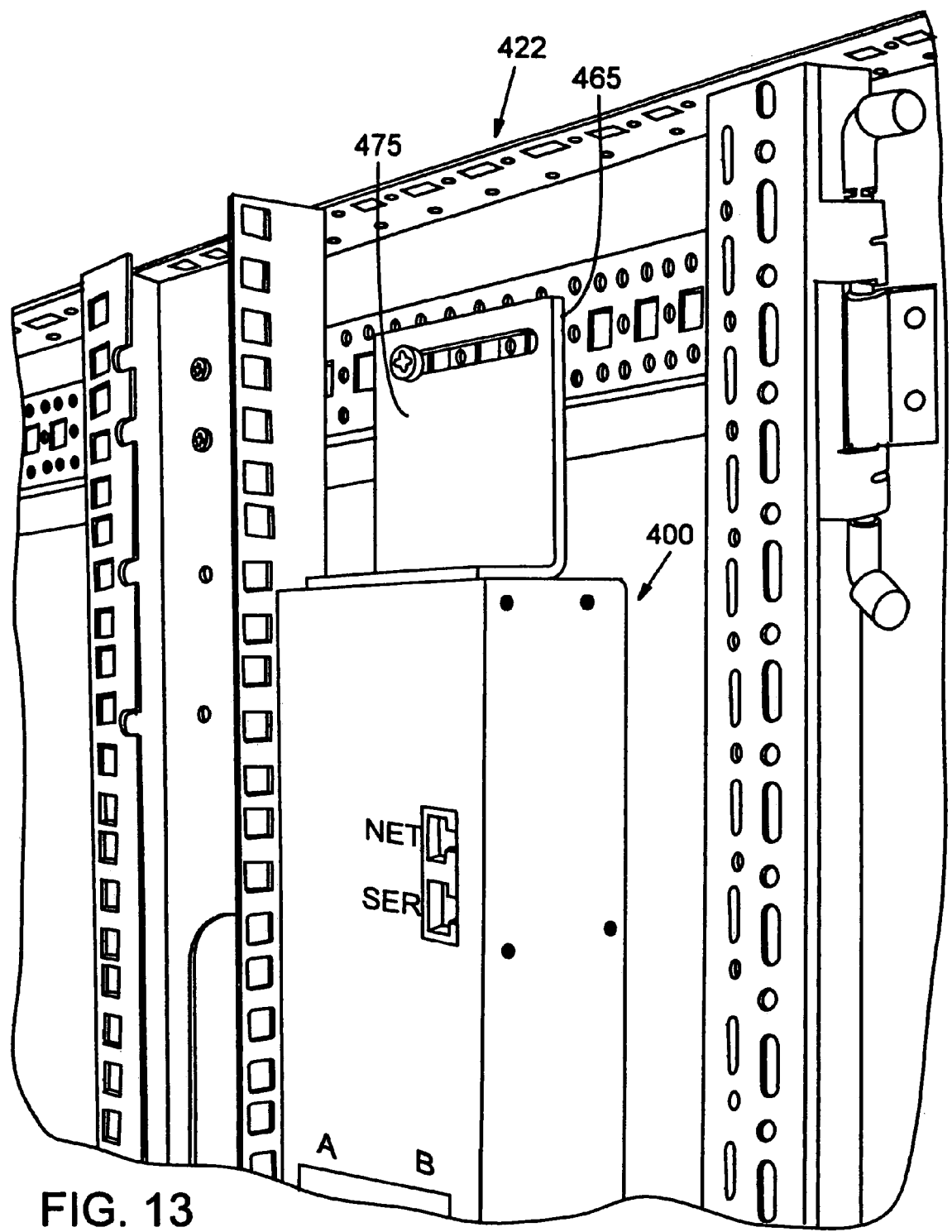
FIG. 13 is an enlarged fragmentary perspective view of the power distribution unit of FIG. 10 showing, in particular, an upper angled mounting bracket for mounting the power distribution unit in a cabinet rack of a third type.

For example, as shown in FIG. 13, an angled mounting bracket 465 is configured to allow the PDA 400 to be mounted to a particular rack 422, such as that manufactured by International Business Machines Corp. of Armonk, N.Y. The bracket 465 includes an upper planar arm 475 extending a length greater than the length of the upper planar arm 474 of angled mounting bracket 464 shown in FIG. 12.

The upper mounting adapter 460 is shown as an integral component, including a concave bent (or curved) portion at the transition between the lower planar arm 468 and the upper planar arm 474. However, rather than being of unitary construction, the upper mounting adapter 460 can be assembled from two or more pieces fastened together. In addition, the upper mounting adapter 460 could be integrally formed on the housing 406 without departing from the scope of the present invention. Furthermore, the dimensions of the upper mounting adapter 460, such as the respective lengths of the upper planar arm 474 and the lower planar arm 468, may be configured as desired to allow the PDA 400 to be mounted on a particular type of rack.

Figure 14:
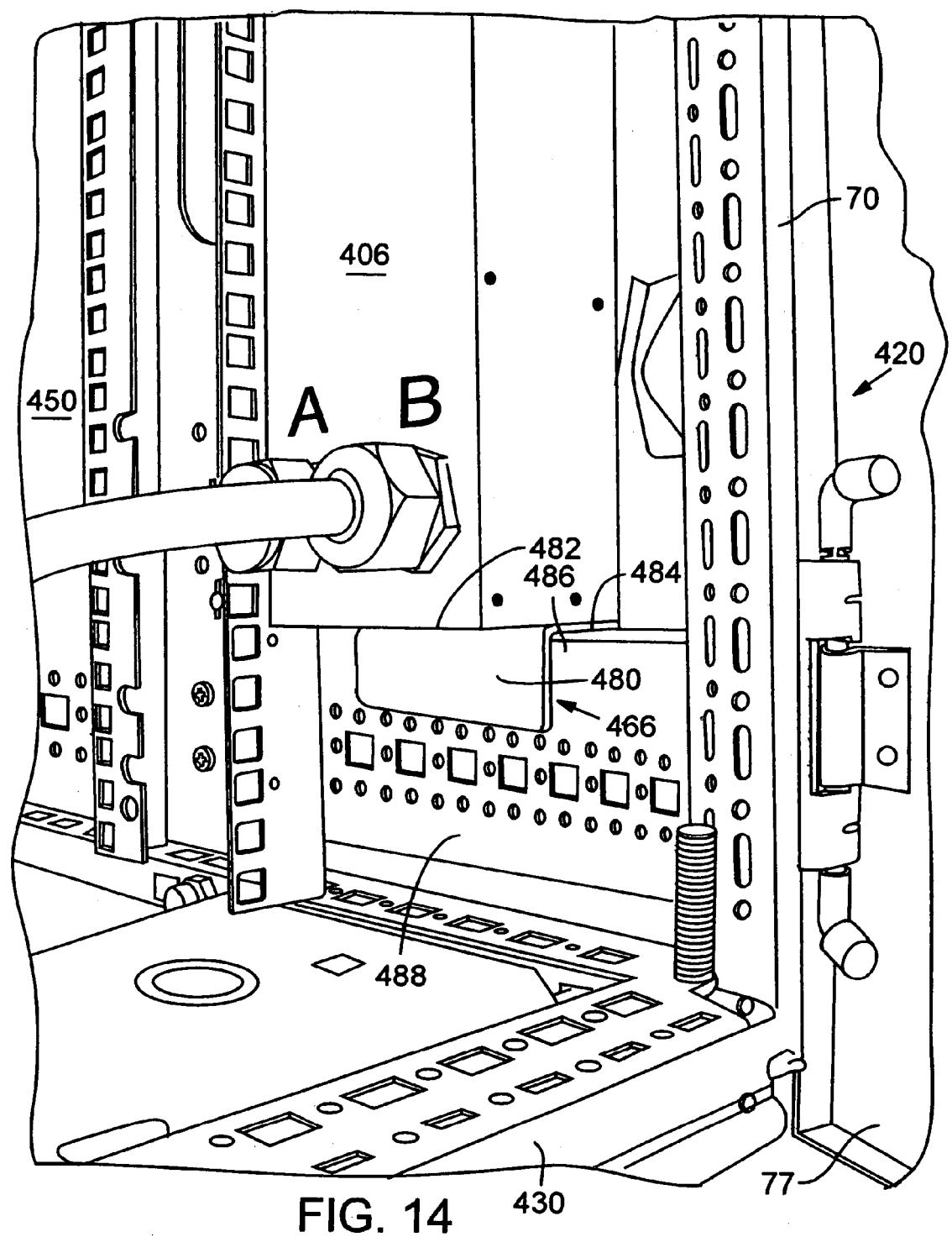
FIG. 14 is an enlarged fragmentary perspective view of the power distribution unit of FIG. 10 showing, in particular, a lower mounting bracket.

With reference to FIG. 14, the lower mounting adapter 466 may be a vertically downwardly oriented U-shaped mounting bracket 480. The lower U-shaped mounting bracket 480 may be secured to the lower planar side 482 of the housing 406. The lower U-shaped mounting bracket 480 may be secured by one or more fasteners (not shown), such as two screws penetrating mating co-axial passages (also not shown) in the center horizontal planar section 484 of the U-shaped mounting bracket 480 and in the lower planar side 482 of the housing 406. The U-shaped mounting bracket 480 provides a laterally and downwardly extending U-shaped channel 486 that mounts upon and surroundingly abuts the mating upwardly extending lower side arm 488 in the rack 420. The housing 406 is thereby secured adjacent the rear side 430 (including rear doors 75, 77 when closed) of the rack 420, intermediate the electronic equipment mounting area 450 and the rear side 430.

Figure 15:
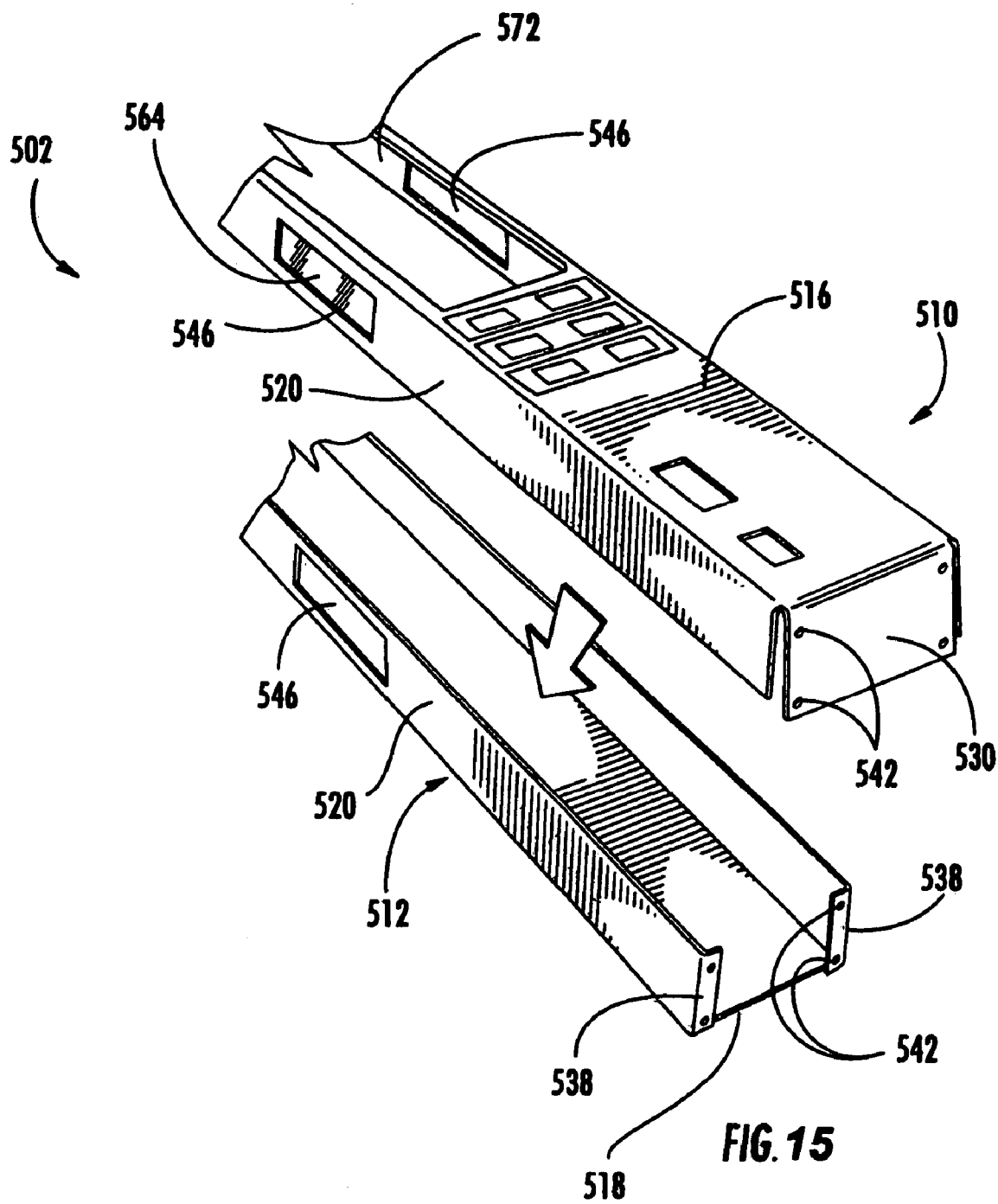
FIG. 15 is a perspective view a portion of the housing of the power distribution units shown in FIGS. 6 and 10, illustrating how top and bottom portions of the housing may fit together.

With reference now to FIG. 15, certain embodiments of a PDA of the present application provide an upper housing portion 510 and a lower housing portion 512 that may be assumed to form a housing allowing convenient access to certain components of a PDA, such as the PDAs described in conjunction with FIGS. 6-14. In at least one embodiment, the housing formed by the upper housing portion 510 and the lower housing portion 512 is adaptable to provide differing fuse and fuse window configurations.

As shown in FIG. 15, the upper housing portion 510 and the lower housing portion 512 are substantially U-shaped. The upper U-shaped portion 510 forms the front face 516 and at least partially forms the lateral sides 520 of the housing. The lower U-shaped portion 512 forms the back face 518 and at least partially forms the lateral sides 520 of the housing.

The lower U-shaped portion 512 and the upper U-shaped portion 510 may be coupled by any suitable means. In the embodiment of FIG. 15, the lower U-shaped portion 512 may slide over and matingly engage the upper U-shaped portion 510. Each end of the upper U-shaped portion 510 may include a flap 530. Each end of the lower U-shaped portion 512 may have U-shaped flanges 538 that matingly engage the outer portion of the flaps 530. The upper U-shaped portion 510 and the lower U-shaped portion 512 are secured together by inserting fasteners (not shown) through fastener openings 542 in the ends of the upper U-shaped portion 510 and the ends of the lower U-shaped portion 512. In at least one embodiment, the fastener openings 542 are threaded for receiving matingly threaded fasteners.

With continued reference to FIG. 15, the upper U-shaped portion 510 has longitudinally distributed rectangular access openings 546 formed in both lateral sides 520. The lower U-shaped portion 512 has longitudinally distributed rectangular access openings 546 formed in one lateral side 520. The access openings 546 of the upper U-shaped portion 510 may be wider than the access openings 546 of the lower U-shaped portion 512 in order to provide access to standoff mount bases (not shown) which provide threaded fastener passages for threading mating screws (not shown) in order to mount fuse access windows or cover plates as described below.

The upper U-shaped portion 510 and the lower U-shaped portion 512 may be assembled so that the access openings 546 provide access to the interior of the housing, such as to fuse mounts 554 (FIG. 16), on a selected lateral side 520 of the housing 506. The access openings 546 may be covered by a protective covering 564, such as a plastic or glass window. In other embodiments, the access openings 546 may be covered by a metal plate. In at least one embodiment, the access openings 546 are covered with a Lucite window. The access openings 546 may be located anywhere on the housing 506, and are located to allow visibility of, and easy access to, certain components, such as fuses (FIGS. 10 and 16) when the PDA is in use. The components may thereby be observed, replaced, or otherwise serviced as desired without the need for removing the PDA from a rack.

Figure 16:
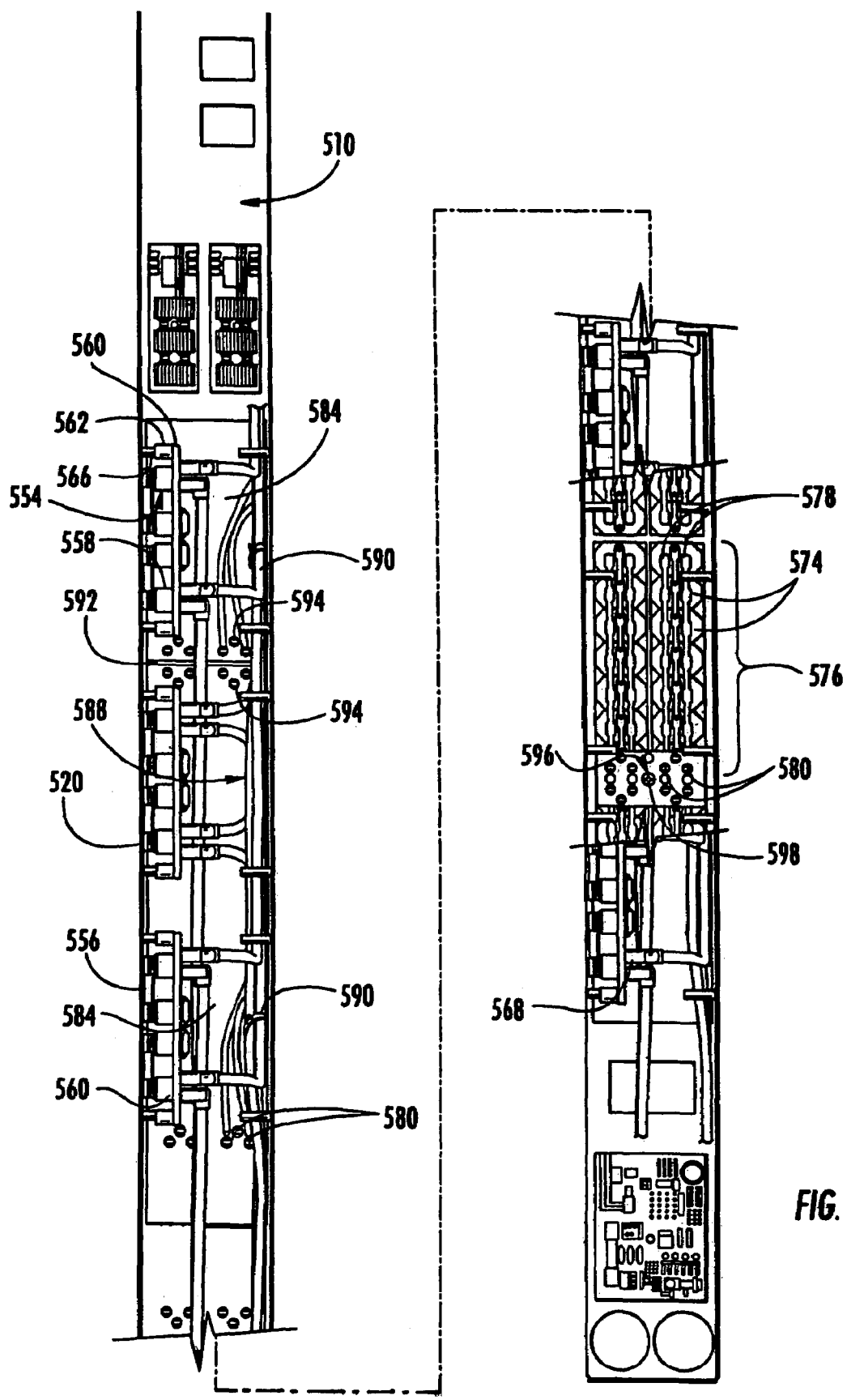
FIG. 16 is a top plan view of a portion of the housing of the power distribution units shown in FIGS. 6 and 10, illustrating various components that may be included in the power distribution units and their arrangement in the housing.

Turning now to FIG. 16, a PDA may have a wide variety of components assembled in the upper housing portion 510. For example, a plurality of fuse assemblies 554 may be positioned in the upper housing portion 510. A fuse 556 may be removed from, or installed into, a fuse assembly 554. The fuse assembly 554 may have two clamp arms 558 to secure each fuse 556 and to place the fuse 556 in electrical communication with a circuit of the PDA. Each fuse assembly 554 may include a fuse board 560. Other power interrupting devices, such as circuit breakers, may be utilized rather than the fuses 556. Fuse boards 560 are positioned longitudinally along a lateral side 520 of the upper U-shaped portion 510. Fuse boards 560 are substantially coincident with access windows 546 (FIG. 15). Each fuse board 560 may be secured to the housing 506 by inserting fasteners (not shown), such as screws, through fastener openings (not shown) adjacent an access window 546, through fuse mounts 566, and into fastener mounts 562 on each fuse board 560. The fuse boards 560 may have a plurality of connection terminals 568 for placing the fuses 556 in electrical communication with other components of the PDA.

As mentioned previously, during assembly, the lateral side 520 on which the interior of the housing 502 is to be accessible may be determined by aligning the access openings 546 (FIG. 15) on lower U-shaped portion 512 with the access openings 546 (FIG. 15) on the desired lateral side 520 of the upper U-shaped portion 510. Of course, the lower U-shaped portion 512 may have access openings 546 on both lateral sides 520, thereby providing access to the interior of the housing 502 on each lateral side 520. In this embodiment, the protective coverings 564 (FIG. 15) could be used to cover the access openings 546 not having fuse mounts 554, or where access to the interior of the housing 502 is otherwise not required.

A plurality of power outputs 574 are mounted in the upper housing portion 510. Each power output 574 may be part of an outlet gang 576. As shown, three power rails or rods 578 are coupled to the back of each outlet gang 576. Depending on the application, more or less power rails 578 could be used. Each of the power rails 578 runs substantially the length of the back side of a corresponding outlet gang 576 and is connected to each output 574 in the outlet gang 576. Each power rail 578 may have a protrusion (not shown) that extends into a particular receptacle (not shown in FIG. 16) of each power output 574 in an outlet gang 576. Each receptacle may receive a prong (not shown) from a power cord (not shown) of an electrical appliance (not shown). The power rails 578 therefore serve to electrically couple each power output 574 in an outlet gang 576. Each power rail 578 may correspond to a particular electrical component, such as a hot, neutral, or ground connection. The power rails 578 can be made from a conducting material, such as a conductive metal.

The use of the power rails 578 obviates individually wiring together multiple individual power outputs 574. Although the power rails 578 are shown as parallel, linear rails, other configurations could be used. For example, the power rails 578 could be curved in order to accommodate an arcuate pattern of power outputs 574 if desired.

Each power rail 578 may be provided with at least one connecting prong 580. The connecting prong 580 may be used to place a power rail 578, and therefore a corresponding outlet gang 576, in electrical communication with other electrical components. The connecting prongs 580 may be coupled to other electrical components by any suitable connecting means. In some embodiments, wires may be used as the connecting means. Of course, the present invention is not limited to power rails 578 having connecting prongs 580. Any suitable means may be used for placing the power rails 578 in electrical communication with other electrical components.

An outlet gang 576 is shown covered by a planar layer of nonconductive material 584 that extends substantially across the width of the upper U-shaped portion 510. More than one piece of the nonconductive material 584 may be used and the nonconductive material 584 may be shaped and sized as desired to insulate the electrical components of the PDA. The nonconductive material 584 may be any suitable material that substantially does not conduct electricity, such as plastics, rubber, and the like. In at least one embodiment, the nonconductive material 584 is Mylar. The nonconductive material 584 can be used to prevent unintended electrical communication between adjacent electrical components, such as between the outlet gang 576 and the fuse board 560.

A plurality of wires 588 may be used to connect various components, such as the outlet gangs 576 and the fuse boards 560. The wires 588 may be insulated wires, in order to help prevent unintended electrical contact between the wires 588 and the other components of the PDA. In addition, the wires 588 may be placed on the opposite side of the nonconductive material 584 from the outlet gangs 576 in order to help prevent such intended contact. The wires 588 are shown as laid out substantially along the side of the upper U-shaped portion 510 opposite the fuse boards 560. The wires 588 may be secured together by fasteners 590, such as locking plastic bands.

The power outputs 574 and other electrical components of the PDA may be connected by various electrical connectors, such as various types of wires. In certain embodiments, including the embodiment of FIG. 16, the electrical connector may be a power connection board 592. The power connection board 592 may be used to connect at least two electrical components. For example, the power connection board 592 may be placed between, and used to connect, two outlet gangs 576, as shown in FIG. 16. The power connection board 592 may be an at least semi-rigid component capable of placing at least two electrical components in electrical communication. In certain embodiments, the power connection board 592 is a printed circuit board. In at least one embodiment, the power connection board 592 is a four-layer printed circuit board.

The power connection board 592 may have a number of holes 594 extending therethrough. The holes 594 may be lined with a conducting material, such as a conductive metal. In at least one embodiment, a connecting prong 580 of a power rail 578 associated with an outlet gang 576 can engage a hole 594. If desired, the connecting prong 580 may be further secured to the connector 592, such as by soldering. As shown in FIG. 16, nonconductive material 584 may be placed between the connecting prongs 580 and the power connection board 592. The connecting prongs 580 may extend through openings (not shown) in the nonconductive material 584.

The power connection board 592 may be coupled to the upper U-shaped portion 510 of the housing 506. In one embodiment, the power connection board 592 is provided with a fastener hole 596. A fastener 598, such as a screw, a nail, a pin, a bolt, etc., may be inserted through the fastener hole 596 and securely received by a mount (not shown) on the upper U-shaped portion 510.

Figure 17:
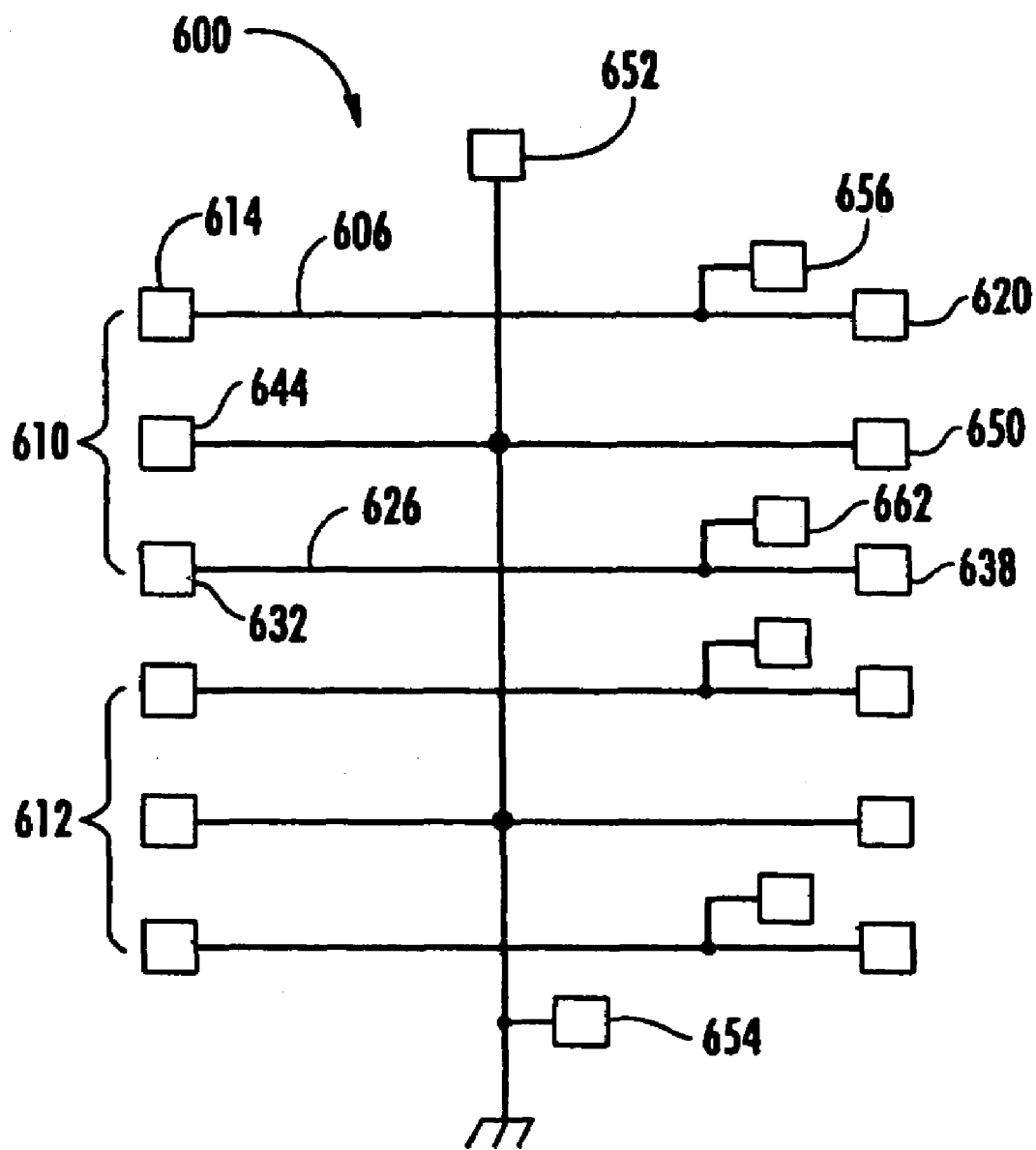
FIG. 17 is a schematic wiring diagram of an embodiment of a power connection board useable in the power distribution units of FIGS. 6 and 10.

A schematic diagram of a printed circuit board 600 useable in this embodiment is shown in FIG. 17. Each layer of the printed circuit board 600 may correspond to a single electrical component. For example, when the circuit board 600 is used for power transmission, one layer may correspond to a "hot" electrical connection, one layer may correspond to neutral connection, and one layer may be a ground connection. The use of an entire layer of the printed circuit board 600 for each connection may allow for larger amounts of electricity to flow through the printed circuit board 600.

FIG. 17 shows two power inlets, 610 and 612, connected to circuit board 600 for distributing power to two outlet gangs 576. Lead 606 of power inlet 610, which may be an AC line power connection, is shown connected to connection point 614. Connection point 614, as well as other connection points, may be a pad. The pad may be an annular ring surrounding a hole in the circuit board 600. The annular ring may be made from a conducting material, such as a conductive metal.

A power rail 578 (FIG. 16) of a first outlet gang 576 (FIG. 16) may also be connected to pad 614. Pad 614 is in electrical communication with pad 620 through the circuit board 600. In turn, pad 620 may be connected to a power rail 578 of a second outlet gang 576. Similarly, lead 626 of power inlet 610, which may be an AC line power neutral connection, may be connected to pad 632. A power rail 578 of the first outlet gang 576 may also be attached to pad 632. Pad 632 is in electrical communication with pad 638. Pad 638 may be connected to a power rail 578 of the second outlet gang 576. Pads 644 and 650 may be ground connections for their respective outlet gangs 576 and be grounded through pads 652 and 654. Leads 606 and 626 may be connected to a fuse board 560 (FIG. 16) through pads 656 and 662, respectively. Additional outlet gangs 576, other electrical components, or additional power inlets, such as power inlet 612, may be connected in a similar manner.

Figure 18:
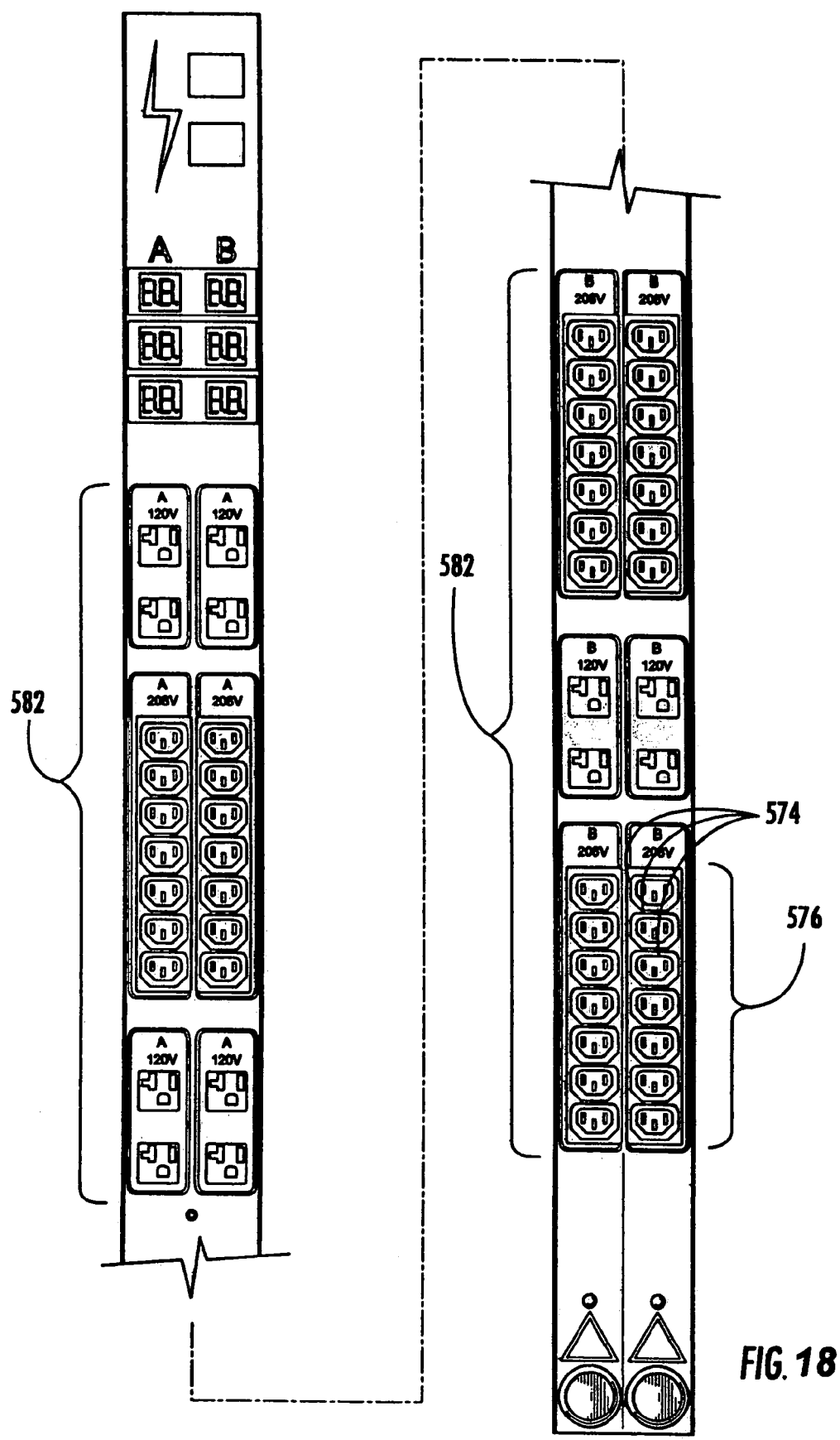
FIG. 18 is a top plan view of a power distribution unit according to an embodiment of the present invention.

As illustrated in FIG. 18, a plurality of power outlets 574 pass through various outlet apertures (not shown). The apertures are rectangular openings in the front face of the housing. One or more apertures, and the associated power outlets 574 extending therethrough, may represent a discrete power unit, or "branch" 582. Each branch 582 may be independently supplied with power, controlled, and wired.

The power outlets 574 may be individual outlets or part of an outlet gang 576, single components having multiple power outlets 574. Suitable outlet gangs are type 0909 ganged outlets available from Shurter, Inc., of Santa Rosa, Calif. The ganged outlets 576 are shown as linear arrangements of the power outlets 574, which may be arranged in columns or rows. Each branch may include one or more ganged outlets 576. As shown, two ganged outlets 576 may be placed side-by-side, providing two columns of outlets 574 longitudinally extending down the front face of the PDA.

The ganged outlets 576 may be configured to deliver the same or different amounts of power to their corresponding power outlets 574. For example, one ganged outlet 576 may provide 120V power while another ganged outlet 576 may provide 240V power. Of course, the present invention is not limited to any particular power configuration. In addition, the ganged outlets 576 may have varying numbers of power outlets 574. The ganged outlets 576 may be used exclusively in the PDA or in conjunction with individual outlets 574.

The power distribution units described above have been described as being in the form of single phase or three phase power distribution devices. A given rack, however, can utilize a power distribution unit that supports either single or three phase power depending on the application involved.

It can thus be seen that certain embodiments provide PDAs that are readily and easily adaptable to be utilized in differing orientations in a cabinet rack and in differing types of cabinet racks. The PDAs are securely mounted in the various cabinet racks and relatively unlikely to be unintentionally jolted out of position in the rack. The PDAs may provide single or polyphase power and associated features, including environmental monitoring, remote control, communications network access, and current monitoring displays. The PDA may also be relatively lighter in weight than correspondingly functioning prior PDAs, which typically include substantially increased quantities of wiring.

Having illustrated and described the principles of the disclosed embodiments, it will be apparent to those skilled in the art that the embodiments can be modified in arrangement and detail without departing from such principles. In view of the many possible embodiments, it will be recognized that the described embodiments include only examples and should not be taken as a limitation on the scope of the invention. Rather, the invention is defined by the following claims. We therefore claim as the invention all possible embodiments and their equivalents that come within the scope of these claims.

We claim:

1. A method of mounting a power distribution apparatus in a rack comprising:
    selecting a rack from amongst a plurality of racks;
    selecting a U-shaped bracket from amongst a plurality of different types of mounting adapters for mounting the power distribution apparatus in the selected rack;
    securing the selected mounting adapter to the power distribution apparatus; and
    fitting the U-shaped bracket over a portion of the rack.

2. A method as in claim 1 and further comprising orienting the power distribution apparatus such that an electrical component within the power distribution apparatus is visible without removing the power distribution apparatus from the rack.

3. A method as in claim 1 and further comprising inserting a fastener through a passage in the selected mounting adapter and through a passage in the rack to secure the power distribution apparatus to the rack.

4. A method of mounting a power distribution apparatus in a rack comprising:
    selecting a rack from amongst a plurality of racks;
    selecting at least one of a plurality of different types of mounting adapters for mounting the power distribution apparatus in the selected rack;
    securing the selected mounting adapter to the power distribution apparatus;
    securing the selected mounting adapter to the selected rack; and
    fitting a channel in the power distribution apparatus over a protrusion in the rack.

5. A method as in claim 4 and further comprising inserting a fastener through a passage in the selected mounting adapter and through a passage in the rack to secure the power distribution apparatus to the rack.

6. A method as in claim 4 and further comprising orienting the power distribution apparatus such that an electrical component within the power distribution apparatus is visible without removing the power distribution apparatus from the rack.

* * * * *